US010663791B2

(12) United States Patent
Gollier et al.

(10) Patent No.: US 10,663,791 B2
(45) Date of Patent: May 26, 2020

(54) MATERIAL SYSTEM HAVING MULTIPLE APPEARANCE STATES FOR A DISPLAY SURFACE OF A DISPLAY UNIT

(71) Applicant: CORNING INCORPORATED, Corning, NY (US)

(72) Inventors: Jacques Gollier, Bellevue, WA (US); Dmitri Vladislavovich Kuksenkov, Elmira, NY (US); William James Miller, Horseheads, NY (US); Daniel Aloysius Nolan, Corning, NY (US); Charlene Marie Smith, Corning, NY (US); James Andrew West, Painted Post, NY (US)

(73) Assignee: CORNING INCORPORATED, Corning, NY (US)

(*) Notice: Subject to any disclaimer, the term of this patent is extended or adjusted under 35 U.S.C. 154(b) by 0 days.

(21) Appl. No.: 15/578,404

(22) PCT Filed: Jun. 1, 2016

(86) PCT No.: PCT/US2016/035131
§ 371 (c)(1),
(2) Date: Nov. 30, 2017

(87) PCT Pub. No.: WO2016/196532
PCT Pub. Date: Dec. 8, 2016

(65) Prior Publication Data
US 2018/0210118 A1    Jul. 26, 2018

Related U.S. Application Data

(60) Provisional application No. 62/169,764, filed on Jun. 2, 2015.

(51) Int. Cl.
*G02F 1/1335* (2006.01)
*C03C 17/00* (2006.01)
(Continued)

(52) U.S. Cl.
CPC ........ *G02F 1/133555* (2013.01); *B32B 17/06* (2013.01); *C03C 3/076* (2013.01);
(Continued)

(58) Field of Classification Search
CPC ............. G02F 1/1335; G02F 1/133555; G02F 1/133788; G02F 1/136;
(Continued)

(56) References Cited

U.S. PATENT DOCUMENTS 6,671,015 B2 * 12/2003  Tanada .............. G02F 1/133555
                                                    349/113
6,853,420 B2 *  2/2005  Tanada .............. G02F 1/133555
                                                    349/113
(Continued)

FOREIGN PATENT DOCUMENTS

| JP | 2008209724 A | 9/2008 |
| WO | 2015031594 A2 | 3/2015 |
| WO | 2015186668 A1 | 12/2015 |

OTHER PUBLICATIONS

International Search Report and Written Opinion of the International Searching Authority; PCT/US2016/035131; dated Aug. 26, 2016; 12 Pages; European Patent Office.

(Continued)

*Primary Examiner* — Bao-Luan Q Le

(57) ABSTRACT

A material system for a surface display unit that includes a first side (i.e., a proximal side) that faces a viewer of the surface display unit and a second side (i.e., a distal side) facing away from the viewer. The material system provides at least three appearance states, including a generally opaque first appearance state when the surface display unit is "off" (i.e., not used to display images), a second appearance state in which the material system is illuminated from the first (i.e., proximal) side to display a first image (e.g., information and/or decoration) that is perceptible to the viewer, and
(Continued)

a third appearance state in which the material system is illuminated from the second (i.e., distal) side to display a second image (e.g., information and/or decoration) that is perceptible to the viewer. Surface display units, systems, and methods comprising the material system are also disclosed.

16 Claims, 10 Drawing Sheets

(51) Int. Cl.
*G02B 1/118* (2015.01)
*G09F 9/30* (2006.01)
*B32B 17/06* (2006.01)
*C03C 3/076* (2006.01)
*C03C 4/18* (2006.01)
*G02F 1/13357* (2006.01)
*B60R 11/00* (2006.01)
*C03C 21/00* (2006.01)
*H01L 27/32* (2006.01)
*H01L 51/52* (2006.01)

(52) U.S. Cl.
CPC ............... *C03C 4/18* (2013.01); *C03C 17/00* (2013.01); *G02B 1/118* (2013.01); *G02F 1/133524* (2013.01); *G09F 9/30* (2013.01); B32B 2307/41 (2013.01); B32B 2307/412 (2013.01); B32B 2307/418 (2013.01); B32B 2457/206 (2013.01); B32B 2457/208 (2013.01); B60R 2011/0005 (2013.01); B60R 2011/0007 (2013.01); C03C 21/002 (2013.01); C03C 2204/04 (2013.01); G02F 2001/133607 (2013.01); G02F 2001/133616 (2013.01); G02F 2001/133626 (2013.01); H01L 27/323 (2013.01); H01L 27/3232 (2013.01); H01L 51/5268 (2013.01)

(58) Field of Classification Search
CPC ... G02F 2001/133761; G02F 1/133524; G02F 2001/133606; G02F 2001/133607; G09G 2300/0456; G09G 2300/08; G09G 3/3648
See application file for complete search history.

(56) References Cited

U.S. PATENT DOCUMENTS

| | | | | |
|---|---|---|---|---|
| 6,900,458 | B2* | 5/2005 | Tung | G02F 1/133603 257/40 |
| 6,975,455 | B1* | 12/2005 | Kotchick | G02B 5/305 359/485.03 |
| 7,345,824 | B2* | 3/2008 | Lubart | G02B 17/002 349/62 |
| 7,480,101 | B2* | 1/2009 | Lubart | G02B 17/002 359/641 |
| 7,573,642 | B2* | 8/2009 | Lubart | G02B 17/002 359/619 |
| 7,595,934 | B2* | 9/2009 | Lubart | G02B 17/002 349/62 |
| 7,745,986 | B2* | 6/2010 | Ito | G02F 1/133555 313/504 |
| 8,552,965 | B2* | 10/2013 | Sumiyoshi | G02F 1/133504 345/102 |
| 8,570,466 | B2* | 10/2013 | Choi | G02F 1/133555 349/113 |
| 8,854,802 | B2 | 10/2014 | Robinson et al. | |
| 8,883,663 | B2 | 11/2014 | Beall et al. | |
| 8,986,072 | B2 | 3/2015 | Darcangelo et al. | |
| 9,122,143 | B2 | 9/2015 | Shields | |
| 9,393,760 | B2 | 7/2016 | He et al. | |
| 9,448,434 | B2* | 9/2016 | Xue | G02F 1/133555 |
| 9,651,720 | B2 | 5/2017 | Lander et al. | |
| 9,721,378 | B2* | 8/2017 | Bell | G02F 1/133603 |
| 9,922,445 | B2* | 3/2018 | Bell | G02F 1/133603 |
| 2002/0054257 | A1* | 5/2002 | Tanada | G02F 1/133555 349/113 |
| 2003/0067432 | A1 | 4/2003 | Watanabe et al. | |
| 2004/0090574 | A1* | 5/2004 | Tanada | G02F 1/133555 349/113 |
| 2005/0259198 | A1* | 11/2005 | Lubart | G02B 17/002 349/113 |
| 2006/0290651 | A1* | 12/2006 | Verhaegh | G02F 1/133555 345/107 |
| 2007/0018943 | A1* | 1/2007 | Bayrle | G02F 1/133555 345/102 |
| 2007/0120465 | A1* | 5/2007 | Ito | G02F 1/133555 313/504 |
| 2007/0133097 | A1* | 6/2007 | Lubart | G02B 17/002 359/641 |
| 2007/0153396 | A1* | 7/2007 | Lubart | G02B 17/002 359/641 |
| 2008/0074588 | A1 | 3/2008 | Sekiguchi et al. | |
| 2008/0144182 | A1* | 6/2008 | Lubart | G02B 17/002 359/622 |
| 2009/0109169 | A1* | 4/2009 | Sumiyoshi | G02F 1/133504 345/102 |
| 2009/0167966 | A1 | 7/2009 | Nam et al. | |
| 2010/0097293 | A1 | 4/2010 | McMahon | |
| 2010/0177025 | A1 | 7/2010 | Nagata et al. | |
| 2011/0261305 | A1* | 10/2011 | Choi | G02F 1/133555 349/114 |
| 2012/0094084 | A1 | 4/2012 | Fisher et al. | |
| 2012/0328843 | A1 | 12/2012 | Cleary et al. | |
| 2013/0086948 | A1 | 4/2013 | Bisson et al. | |
| 2013/0125589 | A1 | 5/2013 | Dannoux et al. | |
| 2013/0125592 | A1 | 5/2013 | Bisson | |
| 2013/0127202 | A1 | 5/2013 | Hart | |
| 2013/0141659 | A1* | 6/2013 | Xue | G02F 1/133555 349/43 |
| 2013/0295357 | A1 | 11/2013 | Cleary et al. | |
| 2013/0319046 | A1 | 12/2013 | Cleary et al. | |
| 2013/0323415 | A1 | 12/2013 | Brackley et al. | |
| 2014/0043565 | A1* | 2/2014 | Ma | G02F 1/133602 349/67 |
| 2014/0087159 | A1 | 3/2014 | Cleary et al. | |
| 2014/0087193 | A1 | 3/2014 | Cites et al. | |
| 2014/0141217 | A1 | 5/2014 | Gulati et al. | |
| 2014/0239034 | A1 | 8/2014 | Cleary et al. | |
| 2014/0356604 | A1 | 12/2014 | Borrelli et al. | |
| 2014/0362076 | A1* | 12/2014 | Bell | G02F 1/133603 345/419 |
| 2015/0064374 | A1 | 3/2015 | Jain et al. | |
| 2015/0111016 | A1 | 4/2015 | Fisher et al. | |
| 2015/0122406 | A1 | 5/2015 | Fisher et al. | |
| 2015/0132538 | A1 | 5/2015 | Cleary et al. | |
| 2015/0140301 | A1 | 5/2015 | Fisher et al. | |
| 2015/0158275 | A1 | 6/2015 | D'Errico et al. | |
| 2015/0158277 | A1 | 6/2015 | Fisher et al. | |
| 2015/0228089 | A1* | 8/2015 | Perdices-Gonzalez | G09G 3/348 345/592 |
| 2015/0228217 | A1* | 8/2015 | Perdices-Gonzalez | G09G 3/348 345/5 |
| 2015/0232366 | A1 | 8/2015 | Fredholm et al. | |
| 2015/0232367 | A1 | 8/2015 | Joubaud et al. | |
| 2015/0251377 | A1 | 9/2015 | Cleary et al. | |
| 2015/0274571 | A1 | 10/2015 | Brennan et al. | |
| 2015/0309309 | A1 | 10/2015 | Laluque et al. | |
| 2015/0321940 | A1 | 11/2015 | Dannoux et al. | |
| 2016/0012630 | A1* | 1/2016 | Bell | G02F 1/133603 345/424 |
| 2016/0048016 | A1 | 2/2016 | Crane et al. | |
| 2016/0082705 | A1 | 3/2016 | Fisher et al. | |
| 2016/0145139 | A1 | 5/2016 | Fredholm et al. | |
| 2016/0207819 | A1 | 7/2016 | Cleary et al. | |

(56) References Cited

U.S. PATENT DOCUMENTS

2016/0207820 A1 7/2016 Cleary et al.
2016/0250825 A1 9/2016 Cleary et al.
2017/0287204 A9 * 10/2017 Bell .................. G02F 1/133603

OTHER PUBLICATIONS

English Translation of CN201680032648.4 First Office Action dated Jan. 24, 2019, China Patent Office, 11 pgs.

* cited by examiner

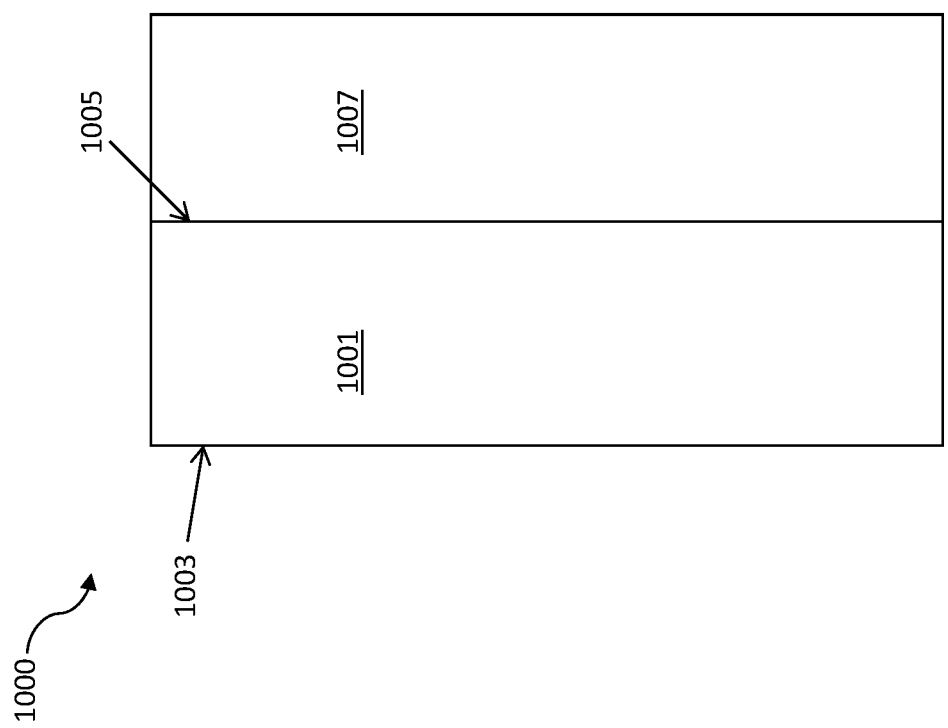

MATERIAL SYSTEM HAVING MULTIPLE APPEARANCE STATES FOR A DISPLAY SURFACE OF A DISPLAY UNIT

CROSS-REFERENCE TO RELATED APPLICATIONS

This application is a national stage entry of International Patent Application Ser. No. PCT/US16/35131 filed on Jun. 1, 2016, which claims the benefit of priority under 35 U.S.C. § 119 of U.S. Provisional Application Ser. No. 62/169,764 filed on Jun. 2, 2015 the content of which is relied upon and incorporated herein by reference in its entirety.

FIELD

The present disclosure relates generally to the field of surface display units and to multi-functional material systems for use in a surface display unit.

BACKGROUND

Surface display units are devices that display images, signs, symbols, and/or messages as needed. Surface display units may be configured to display a predefined shape, word, symbol, message, and/or image, for example. Examples of such surface display units include warning lights on a stove when the surface temperature of a heating unit is hot, warning lights for indicating low fuel status or unbuckled seat belt on an automobile, traffic or crosswalk lights on roads, and so on. Alternately, a surface display unit may be configured to display a selected display content out of many possibilities. Typically, such surface display units are multipixel display devices, i.e., display devices employing multiple pixels. The mechanism for providing illumination in multipixel display devices may include light emitting diodes (including organic light emitting diodes) and liquid crystal displays. Products employing multipixel display devices include computer monitors, television sets, screens of portable digital devices, and so on.

Surface display units typically need to be mechanically protected in order to prevent accidental damage. The need to provide protection to surface display units may be greater for surface display units that are subjected to mechanical impact and/or temperature extremes. For example, inside surfaces of automobile (such as the dashboard, door panels, and backside surfaces of seats), televisions, monitors, household appliances or architectural structures may be subjected to accidental pushing, pressing, or rubbing by the users, and may be subjected to temperature extremes, e.g. in the summer or in the winter in certain climates.

Further, sunlight can shine on surface display units (especially in automobiles and buildings) from time to time, reducing the clarity of the signal or message, or level of enjoyment of the user from time to time. In addition, surface texture providing a luxurious atmosphere may be desirable for surface display units incorporated into vehicles such as automobiles, boats, and airplanes (e.g., glazing such as windshields, windows or sidelites, mirrors, pillars, side panels of a door, headrests, dashboards, consoles, or seats of the vehicle, or any portions thereof), architectural fixtures or structures (e.g., internal or external walls of building, and flooring), appliances (e.g., a refrigerator, an oven, a stove, a washer, a dryer, or another appliance), consumer electronics (e.g., televisions, laptops, computer monitors, and handheld electronics such as mobile phones, tablets, and music players), furniture, information kiosks, retail kiosks, and the like.

SUMMARY

According to various aspects of the disclosure, a material system for a surface display unit comprises a first side configured to face a viewer of the surface display unit and a second side opposite the first side that faces away from the viewer. The material system is configured to have at least three appearance states, including a generally opaque first appearance state when the surface display unit is not displaying an image, a second appearance state wherein the material system is illuminated from the first side to display a first image that is perceptible to the viewer, and a third appearance state wherein the material system is illuminated from the second side to display a second image that is perceptible to the viewer. In some instances, the material system may exhibit the second and third appearance states simultaneously.

Further embodiments include surface display units, systems, and methods that comprise material systems according to embodiments of the disclosure. The surface display units may be located in an interior surface of a vehicle, for example. In some instances, the surface display units may be utilized in architectural fixtures or structures, other appliances (e.g., ranges, stoves, dishwashers, wine coolers, washers, dryers, etc.), consumer electronics (e.g., televisions, laptops, computer monitors, handheld electronics such as mobile phones, tablets, music players, etc.), furniture, information kiosks, retail kiosks, and the like.

BRIEF DESCRIPTION OF THE DRAWINGS

FIG. 10 is a schematic cross-sectional view of a material system for a surface display unit that includes a switchable material that is capable of being switched between two states to provide variable opacity.

DETAILED DESCRIPTION

Figure 1:
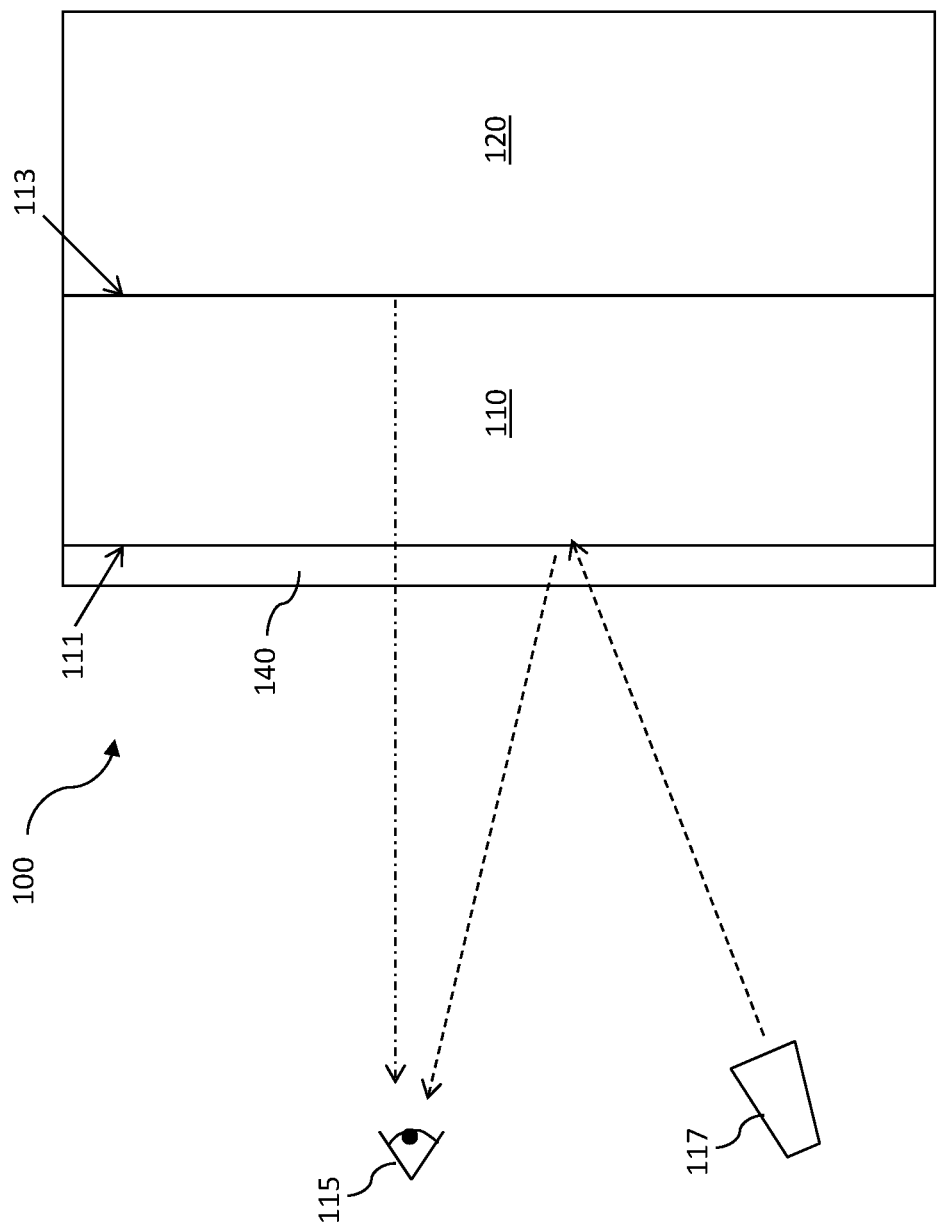
FIG. 1 is a schematic vertical cross-sectional view of an exemplary surface display unit having a material system that provides at least three different appearance states.

As discussed above, the present disclosure is directed to multi-functional material systems for use in a surface display unit, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure without limitation. As used herein, a first element located "on" a second element can be located on an exterior side of a surface of the second element or on an interior side of the second element. As used herein, a first element is located "directly on" a second element if there exists a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, or may have one or more layer thereupon, thereabove, and/or therebelow.

As used herein, the phrase "appearance state" is meant to convey the outward look of the material system and/or the surface display unit to a viewer.

As used herein, the phrase a "generally opaque" appearance is meant to indicate that the material system and/or the surface display unit appears opaque or substantially opaque to the viewer. Generally opaque includes a transmittance of 0% to about 25% within the wavelength range from 400 nm to 800 nm.

In overview, various embodiments relate to material systems for a surface display unit. The material system may include a first side (i.e., a proximal side) that faces a viewer and a second side opposite the first side (i.e., a distal side) that faces away from the viewer when the material system is incorporated into a surface display unit. The material system may have at least three appearance states, including a generally opaque first appearance state when the surface display unit is "off" (i.e., not used to display images), a second appearance state when the material system is illuminated from the first (i.e., proximal) side to display a first image (e.g., information and/or decoration) that is perceptible to the viewer, and a third appearance state when the material system is illuminated from the second (i.e., distal) side to display a second image (e.g., information and/or decoration) that is perceptible to the viewer. Various material systems that may provide these three appearance states, i.e. when off, illuminated from the first side, and illuminated from the second side, are described in more detail below. The material system may exhibit the second and third appearance states simultaneously.

Referring to FIG. 1, an exemplary surface display unit 100 is illustrated, which includes a multi-functional material system 110 having a first (i.e., proximal) side 111, and a second (i.e., distal) side 113. A viewer 115 may view the surface display unit 100 from the first side 111 of the material system 110. A first optical source 117 may illuminate the first (i.e., proximal) side 111 of the material system 110 such that a first optical image may be viewed by the viewer 115. A second optical source 120 may illuminate the second (i.e., distal) side 113 of the material system 110 such that a second optical image may be viewed by the viewer 115. As used herein, an "optical image" can be any image that is generated by light (for example generated by a pattern of light). The light can be monochromatic, polychromatic, or can be a continuous spectrum of wavelengths. The optical image may include information, such as pictures, letters, numbers, etc. and/or a decorative element, such as one or more colors or patterns. The first and second optical images may be displayed separately from one another (e.g., temporally separate such that only one of the first optical image and the second optical image is displayed at a given time and/or spatially separate such that the first optical image and the second optical image are displayed simultaneously on different areas/regions of the surface display unit 100). In embodiments, the first and second optical imaged may be displayed in conjunction with one another (e.g., such that the first and second optical image are displayed at the same time and/or at least partially overlap on the viewed surface of the display unit 100).

As illustrated in the exemplary embodiment of FIG. 1, the first optical source 117 may be any type of projection unit that projects optical radiation onto all or a portion of the first (i.e., proximal) side 111 of the material system 110. The second optical source 120 may optionally be an image panel that may be adjacent to the second (i.e., distal) side 113 of the material system 110. The second optical source 120 may optionally be bonded to the second side 113 of the material system 110, such as by a thin (e.g., 0.5-100 micron) adhesive layer (not shown in FIG. 1). The image panel 120 may comprise a micro-light emitting diodes (LEDs), an organic-LED (or OLED), a liquid crystal display (LCD), a plasma cell, an electroluminescent (EL) cell array, or another suitable element configured to emit radiation. In one or more embodiments, the image panel 120 may include an array pattern of micro-LEDs that are provided such that each micro-LED constitutes a sub-pixel of a pixilated display device. In various embodiments, a layer of a semiconductor material (such as silicon) may control the amount of light each micro-LED emits. Thus, each micro-LED itself serves as the component that forms an image. In one embodiment, the micro-LED's may be provided as a pixilated display device including a set of multiple micro-LED's having different colors within each pixel. In other embodiments, the second optical source 120 may comprise an LCD array, an organic light-emitting diode (OLED) array or an electrophoretic display, for example. In some embodiments, the second optical source 120 may be a rear projection unit that projects optical radiation onto the second (i.e., distal) side 113 of the material system 110.

In other embodiments, the second optical source 120 may be a display unit that generates an image employing a single illumination source, such as a dead front display device. An optional light blocking material layer (not shown in FIG. 1) may be provided between the second (i.e., distal) side 113 of the material system 110 and the second optical source 120. The light blocking material layer may include at least one open region, for example in the form of a stencil, in a predetermined shape or pattern. Light from the second optical source 120 may be projected through the open region to display the predetermined shape or pattern, which may provide a functional indicator, for example.

In some embodiments, the surface display unit 100 may be integrated with a touch sensor 140 over all or a portion of one side (e.g. the first side) of the surface display unit 100 in order to provide touch screen functionality. The touch sensor 140 may utilize any suitable technology, such as capacitive, resistive or optically-based touch sensor technologies. The touch surface may, in various embodiments, have a glass-like feel (i.e., it is easily "swipeable"), be mechanically robust (i.e., may be touched many times without being damaged), and/or provide accurate and precise touch functionality with a quick response time.

In embodiments, one or both of the first and second optical images displayed on the surface display unit 100 may be high-quality images. The image(s) that are displayed may include alpha-numeric characters or symbols (e.g., speedometer, direction indicator, etc.) as well as high-resolution still and moving (e.g., video) images. For example, the displayed images may have an image resolution of ~150-300 ppi or higher. Video images may be shown, for example, in 720p format.

The displayed images may be bright with good contrast, and may be viewable in direct sunlight (e.g., up to 70 kLux). The displayed images are preferably not disturbed or distorted by ambient light coming from an arbitrary direction in at least certain embodiments. In some examples, the display surface is at least partially transparent to visible light. Ambient light (e.g., sunlight) may make the display image difficult or impossible to see when projected on such a display surface. In some examples, the display surface, or portion thereof on which the display image is projected, can include a darkening material such as, for example, an inorganic or organic photochromic or electrochromic material. Thus, the transparency of the surface can be adjusted to increase the contrast of the display image provided at the display surface. For example, the transparency of the display surface can be reduced in bright sunlight by darkening the display surface to increase the contrast of the display image. The adjustment can be controlled automatically (e.g., in response to exposure of the display surface to a particular wavelength of light, such as ultraviolet light, or in response to a signal generated by a light detector, such as a photoeye) or manually (e.g., by a viewer). The transmittance through the display unit 100 may be at least 10% within the display emission area.

The displayed images may be viewable over a wide angular range, or may be configured to be viewable only over a limited angular range. The displayed images may be crisp with reduced or eliminated "halo" effect. The transition between appearance states of the display unit 100 (i.e., between an "off" state and a display state in which the display unit 100 is illuminated from the proximal and/or distal sides) may be instantaneous or substantially instantaneous with little or no perceptible delay. In embodiments, when the display unit 100 is in an "off" state, the display unit 100 may blend into the surrounding environment. For example, for an automotive display, the surface display unit 100 may have a color and/or finish that matches the surrounding interior surface of the automobile. The surface of the display unit 100 facing the viewer 115 may optionally include an anti-glare texturing or coating to provide a matte finish and/or an anti-reflective texturing or coating.

The surface display unit 100 may be planar or substantially planar, or may have a curved or other three-dimensional shape. For example, the surface display unit 100 may have a curved shape that follows the contour of the surface in which the display unit 100 is located, such as an interior surface of a vehicle.

Figure 2:
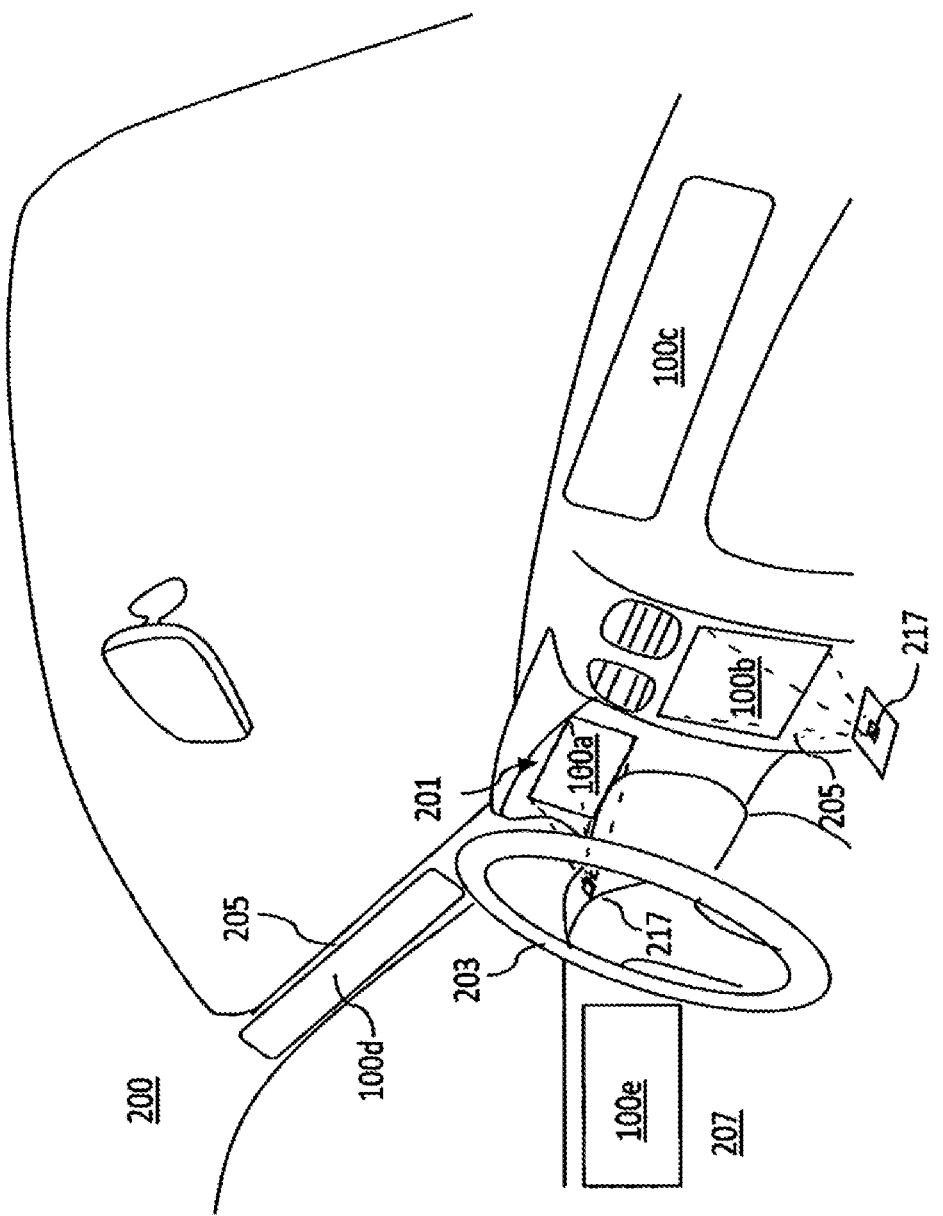
FIG. 2 is a schematic perspective view of the inside of an automobile having a plurality of exemplary surface display units incorporated therein according to an embodiment of the present disclosure.

FIG. 2 schematically illustrates a plurality of surface display units 100 in the interior of a vehicle 200. In this embodiment, a first surface display unit 100a is located on the dashboard 201 behind the steering wheel 203 on the driver's side, a second surface display unit 100b is located on the center console 205, a third surface display unit 100c is located on the dashboard 201 on the passenger's side, a fourth surface display unit 100d is located on a pillar 205, and a fifth surface display unit 100e is located on the interior surface of a door 207. It will be understood that any number of display units may be located on any suitable interior surface of the vehicle 200. Each of the surface display units may be used to selectively display a variety of information and/or decorative elements, including without limitation, instrumentation and controls for the vehicle, navigation information, road hazard warnings, video feed from an external camera (e.g., a rear camera or other blind-spot camera) or other content (e.g., entertainment). In some embodiments, the display units may be used to modify the aesthetic appearance of the vehicle's interior, such as by changing the color scheme and/or visual styling of the vehicle's interior.

Each of the exemplary surface display units 100a-100e illustrated in FIG. 2 may be similar to the display unit 100 shown in FIG. 1, and may include at least three appearance states. One or more projection units 217 within the vehicle 200 may be configured to illuminate the front sides of one or more of the surface display units 100a-100e to generate a first optical image. An additional optical source, which may optionally be an image panel 120 as described above with reference FIG. 1, may illuminate the rear side of one or more of the display units 100a-100e to generate a second optical image. When the surface display units 100a-100e are in an off state, the display units 100a-100e may have a generally opaque appearance when viewed from the front side and may optionally hide components (e.g. an instrument cluster) located behind the display unit 100a-100e. In embodiments, the display units 100a-100e in the off state may have a color (e.g., white, black, brown, red, blue, gray, etc.) that may match a color of the interior surface of the vehicle in which the display unit is located. Thus, when the surface display unit 100 is off, it may blend in with the interior design of the vehicle. The surface display unit 100 may be made in any arbitrary color scheme and/or surface finish, including a mirror-like finish.

The surface display units 100a-100e in various embodiments may optionally be lightweight and/or satisfy applicable regulatory requirements (e.g., with respect to mechanical strength, etc.) as required for use in vehicles. In various embodiments, the surface display units 100a-100e may be relatively low cost and/or characterized by low power consumption. As discussed above, the surface display units 100a-100e may optionally be made with a three-dimensional shape to fit seamlessly onto a surface, such as a vehicle interior. The surface display units 100a-100e may be made in any arbitrary size and shape, and may have a screen size with dimensions on the order of a few centimeters (e.g., about 1 to 10 cm) to a about a meter or more, depending on the application for which it may be used. The surface display units 100a-100e may operate reliably over a wide temperature range, and may be capable of withstanding temperatures as low as about −40° C. and as high as about 85° C.

Referring again to FIG. 1, a surface display unit 100 according to various embodiments includes a material system 110 having a generally opaque appearance when viewed from the first (i.e., proximal) side 111 and may be configured to display a first optical image when illuminated from the first (i.e., proximal) side 111 and a second optical image when illuminated from the second (i.e., distal) side 113. In various exemplary and non-limiting embodiments, the material system 110 may comprise one or more layers comprising a glass material (e.g., soda lime glass, alkali aluminosilicate glass, alkali containing borosilicate glass and/or alkali aluminoborosilicate glass), a glass-ceramic material, a polymeric material, and/or a poly-ceramic material, for example. The material may, in various embodiments, be provided as a single sheet or as part of a laminate or stacked structure. In exemplary embodiments where a laminate or stacked structure is employed for the material system 110, the layers of the material system 110 may be chosen from the same or different materials, and the layers of the material system 110 may directly physically contact one another or may be separated from one another by an intervening layer (such as an adhesive layer) or by a gap (e.g., an air gap).

Glass materials used in embodiments of the material system 110 may be provided using a variety of different processes. For instance, where the glass material may be formed using known forming methods include float glass processes and down-draw processes such as fusion draw and slot draw. In some embodiments, the glass material may be formed from a "phase-separable" glass composition which may undergo phase separation into two or more distinct phases upon exposure to a phase separation treatment, such as a heat treatment or the like, to produce a "phase separated" glass including distinct glass phases having different compositions.

A glass material prepared by a float glass process may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass material that can be lifted from the tin onto rollers. Once off the bath, the glass material can be cooled further and annealed to reduce internal stress.

Down-draw processes produce glass materials having a uniform thickness that possess relatively pristine surfaces. Because the average flexural strength of glass materials is controlled by the amount and size of surface flaws, a pristine surface that has had minimal contact has a higher initial strength. When this high strength glass material is then further strengthened (e.g., chemically), the resultant strength can be higher than that of a glass material with a surface that has been lapped and polished. Down-drawn glass materials may be drawn to a thickness of less than about 2 mm. In addition, down drawn glass materials have a very flat, smooth surface that can be used in its final application without costly grinding and polishing.

The glass material may be formed using a fusion draw process, for example, which uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass material. The fusion draw method offers the advantage that, because the two glass films flowing over the channel fuse together, neither of the outside surfaces of the resulting glass material comes in contact with any part of the apparatus. Thus, the surface properties of the fusion drawn glass material are not affected by such contact.

The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous material and into an annealing region.

In some embodiments, the compositions used for the glass material may be batched with about 0 mol % to about 2 mol. % of at least one firing agent selected from a group that includes $Na_2SO_4$, NaCl, NaF, NaBr, $K_2SO_4$, KCl, KF, KBr, and $SnO_2$.

Once formed, a glass material may be strengthened to form a strengthened glass material. It should be noted that glass-ceramics described herein may also be strengthened in the same manner as glass materials. As used herein, the term "strengthened material" may refer to a glass material or a glass-ceramic material that has been chemically strengthened, for example through ion-exchange of larger ions for smaller ions in the surface of the glass or glass-ceramic material. However, other strengthening methods known in the art, such as thermal tempering, may be utilized to form strengthened glass materials and/or glass-ceramic materials. In some embodiments, the materials may be strengthened using a combination of chemical strengthening processes and thermally strengthening processes.

The strengthened materials described herein may be chemically strengthened by an ion exchange process. In the ion-exchange process, typically by immersion of a glass or glass-ceramic material into a molten salt bath for a predetermined period of time, ions at or near the surface(s) of the glass or glass-ceramic material are exchanged for larger metal ions from the salt bath. In one embodiment, the temperature of the molten salt bath is in the range from about 400° C. to about 430° C. and the predetermined time period is about four to about twenty-four hours; however the temperature and duration of immersion may vary according to the composition of the material and the desired strength attributes. The incorporation of the larger ions into the glass or glass-ceramic material strengthens the material by creating a compressive stress in a near surface region or in regions at and adjacent to the surface(s) of the material. A corresponding tensile stress is induced within a central region or regions at a distance from the surface(s) of the material to balance the compressive stress. Glass or glass-ceramic materials utilizing this strengthening process may be described more specifically as chemically-strengthened or ion-exchanged glass or glass-ceramic materials.

In one example, sodium ions in a strengthened glass or glass-ceramic material are replaced by potassium ions from the molten bath, such as a potassium nitrate salt bath, though other alkali metal ions having larger atomic radii, such as rubidium or cesium, can replace smaller alkali metal ions in the glass. According to particular embodiments, smaller alkali metal ions in the glass or glass-ceramic can be replaced by Ag+ ions. Similarly, other alkali metal salts such as, but not limited to, sulfates, phosphates, halides, and the like may be used in the ion exchange process.

The replacement of smaller ions by larger ions at a temperature below that at which the glass network can relax produces a distribution of ions across the surface(s) of the strengthened material that results in a stress profile. The larger volume of the incoming ion produces a compressive stress (CS) on the surface and tension (central tension, or CT) in the center of the strengthened material. The compressive stress is related to the central tension by the following relationship:

$$CS=CT(t-2DOL/DOL)$$

where t is the total thickness of the strengthened glass or glass-ceramic material and compressive depth of layer (DOL) is the depth of exchange. Depth of exchange may be described as the depth within the strengthened glass or glass-ceramic material (i.e., the distance from a surface of the glass material to a central region of the glass or glass-ceramic material), at which ion exchange facilitated by the ion exchange process takes place.

In one embodiment, a strengthened glass or glass-ceramic material can have a surface compressive stress of about 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened glass or glass-ceramic material may have a compressive depth of layer about 15 μm or greater, 20 μm or greater (e.g., 25 μm, 30 μm, 35 μm, 40 μm, 45 μm, 50 μm or greater) and/or a central tension of about 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened glass or glass-ceramic material has one or more of the following: a surface compressive stress greater than about 500 MPa, a depth of compressive layer greater than about 15 μm, and a central tension greater than about 18 MPa.

Example glasses that may be used in the glass material may include alkali aluminosilicate glass compositions or alkali aluminoborosilicate glass compositions, though other glass compositions are contemplated. Such glass compositions may be characterized as ion exchangeable. As used herein, "ion exchangeable" means that a material comprising the composition is capable of exchanging cations located at or near the surface of the material with cations of the same valence that are either larger or smaller in size. One example glass composition comprises $SiO_2$, $B_2O_3$ and $Na_2O$, where $(SiO_2+B_2O_3) \geq 66$ mol. %, and $Na_2O \geq 9$ mol. %. In an embodiment, the glass composition includes at least 6 wt. % aluminum oxide. In a further embodiment, the material includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the material can comprise 61-75 mol. % $SiO2$; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the material system 110 comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. % $\leq (Li_2O+Na_2O+K_2O) \leq 20$ mol. % and 0 mol. % $\leq$ (MgO+CaO) $\leq 10$ mol. %.

A still further example glass composition suitable for the glass material comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % $\leq (Li_2O+Na_2O+K_2O) \leq 18$ mol. % and 2 mol. % $\leq$ (MgO+CaO) $\leq 7$ mol. %.

In a particular embodiment, an alkali aluminosilicate glass composition suitable for the glass material comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $((Al_2O_3+B_2O_3)/\Sigma \text{modifiers}) > 1$, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $((Al_2O_3+B_2O_3)/\Sigma \text{modifiers}) > 1$.

In still another embodiment, the glass material may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. % $\leq SiO_2+B_2O_3+CaO \leq 69$ mol. %; $Na_2O+K_2O+B_2O_3+MgO+CaO+SrO>10$ mol. %; 5 mol. % $\leq MgO+CaO+SrO \leq 8$ mol. %; $(Na_2O+B_2O_3)-Al_2O_3 \leq 2$ mol. %; 2 mol. % $\leq Na_2O-Al_2O_3 \leq 6$ mol. %; and 4 mol. % $\leq (Na_2O+K_2O)-Al_2O_3 \leq 10$ mol. %.

In an alternative embodiment, the glass material may comprise an alkali aluminosilicate glass composition comprising: 2 mol % or more of $Al_2O_3$ and/or $ZrO_2$, or 4 mol % or more of $Al_2O_3$ and/or $ZrO_2$.

In some embodiments, the material system 110 may comprise a glass-ceramic material that may be fusion-formed or formed by other known methods such as rolling, thin-rolling, slot draw or float.

Exemplary glass-ceramics that may be used in various embodiments of the material system 110 may be characterized by the processes by which they can be formed. Such glass-ceramics may be formed by float processes, fusion processes, slot draw process, thin rolling processes, or a combination thereof. Some glass-ceramics tend to have liquids viscosities that preclude the use of high throughput forming methods such as float, slot draw, or fusion draw. For example, some known glass-ceramics are formed from precursor glasses having liquids viscosities of about 10 kP, which are not suitable for fusion draw, where liquids viscosities of above about 100 kP or above about 200 kP are generally required. Glass-ceramics formed by the low throughput forming methods (e.g., thin rolling) may exhibit enhanced opacity, various degrees of translucency, and/or surface luster. Glass-ceramics formed by high throughout methods (e.g., float, slot draw, or fusion draw) can achieve very thin layers. Glass-ceramics formed by fusion draw methods may achieve pristine surfaces and thinness (e.g., about 2 mm or less). Examples of suitable glass-ceramics may include $Li_2O$—$Al_2O_3$—$SiO_2$ system (i.e. LAS-System) glass-ceramics, MgO—$Al_2O_3$—$SiO_2$ system (i.e. MAS-System) glass-ceramics, glass-ceramics including crystalline phases of any one or more of mullite, spinel, α-quartz, β-quartz solid solution, petalite, lithium disilicate, β-spodumene, nepheline, and alumina, and combinations thereof.

Figure 3:
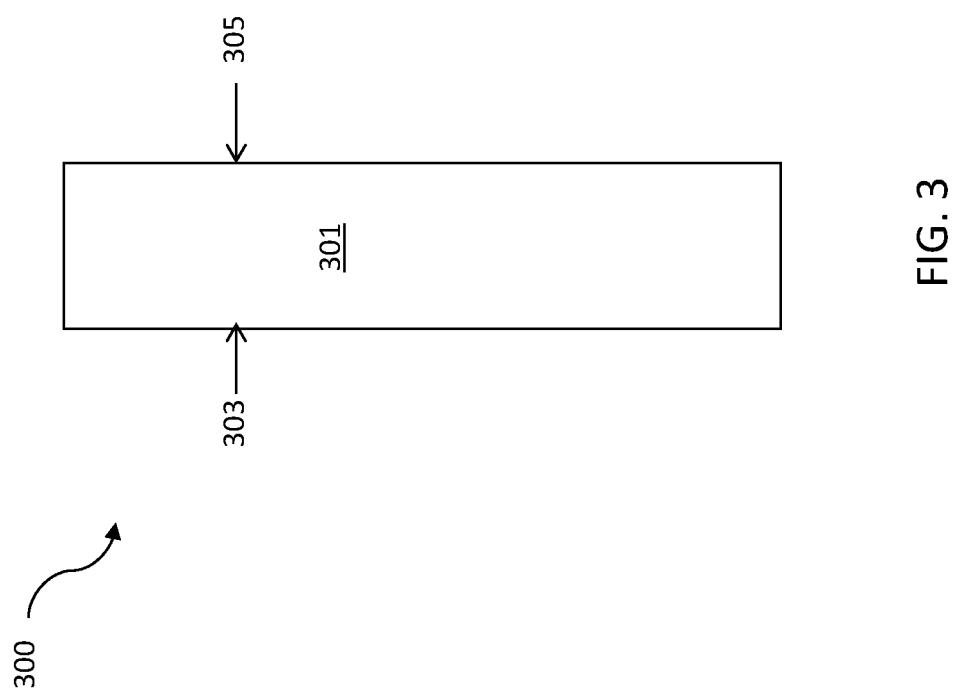
FIG. 3 is a schematic vertical cross-sectional view of a material system for a surface display unit comprising a material body having a higher degree of opacity on a first (i.e., proximal) side relative to a second (i.e., distal) side.

FIG. 3 illustrates an exemplary material system 300 for a surface display unit that includes a material body 301 (e.g. a glass material body) that is characterized by a higher degree of opacity on a first surface 303 than on a second surface 305. When the exemplary material body 301 is incorporated in a surface display unit, the first surface 303 may face the viewer and provide an opaque appearance to the surface display unit. The first surface 303 may also promote scattering of optical radiation incident on the first surface 303. Thus, the material body 301 may enable high-quality display of images projected onto the first surface 303. The second surface 305 may have a higher degree of transparency (i.e., less scattering) relative to the first surface 303. Thus, the second surface 305 may provide increased transmittance of optical radiation incident on the second surface 305 of the material body 301. In some embodiments, the thickness of the material body 301 may be relatively low to reduce or eliminate a "halo" effect in the displayed images. The material body 301 may, for example, be a thin glass material layer having a strengthening material (e.g., an anti-shatter film) on the second surface 305.

In embodiments, the different optical characteristics of the first surface 303 and the second surface 305 of the material body 301 may be provided by a variation in the microstructure of the material body 301. For example, the material body 301 may be a glass-ceramic material having a variation in microstructure through the thickness of the material. In one embodiment, the glass-ceramic material may be formed having a gradient in crystal grain size such that the average crystal grain size proximate to the first surface 303 is larger than the average crystal grain size proximate to the second surface 305 of the material body 301. The larger grain sizes proximate to the first surface 303 may, in various embodiments, provide increased opacity and scattering relative to the smaller grain sizes proximate to the second surface 305.

Glass-ceramics are polycrystalline materials formed by a controlled crystallization of a precursor glass. Such materials may be produced by melting a glass-forming batch containing selected metal oxides, cooling the melt to a temperature below its transformation range while forming a glass body in a desired geometry, and heating the glass body above the transformation range of the glass in a controlled manner (i.e., "ceramming") to generate crystals in situ.

In one embodiment, a glass-ceramic material having a variable microstructure may be fabricated by performing the ceramming process in an environment such that the average crystal grain size proximate to a first surface is larger than the average crystal grain size proximate to a second surface. For example, the material body 301 may be subjected to a temperature gradient during the ceramming to promote larger crystal growth on one side of the material body.

Alternately or in addition, a variable microstructure may be induced by varying the chemical structure of the material body prior to crystal growth, followed by ceramming to provide a glass-ceramic material having a variation in crystal grain size over its thickness. For example, U.S. Pat. No. 8,883,663 to Beall et al. ("the '663 patent"), which is incorporated by reference herein in its entirety, describes a method for forming a glass ceramic material that includes batch melting and down drawing a glass body (e.g., containing 40-80% $SiO_2$, 2-30% $Al_2O_3$, 5-30% $Na_2O$, 0-8 $TiO_2$, 0-12 $ZrO_2$, 0-2% $SnO_7$, 0-7% $B_2O_3$, 0-4% MgO, 0-6% ZnO, 0-8% BaO, 0-3% CaO 0-3, 0-6% SrO 0-6, 0-4% $K_2O$, 0-2% $Li_2O$, 0-1.0% $Sb_2O_3$, 0-0.25% Ag, 0-0.25 $CeO_2$, in weight percent on an oxide basis, where the molar ratio of $Na_2O/Al_2O_3+B_2O_3$ is greater than 0.8, and the combination of $TiO_2+ZrO_2+SnO_2$ is in an amount of at least 3.0 wt %), followed by performing an ion exchange process by placing the glass body in a Li-containing salt bath at a temperature above the glass strain point and holding the glass sheet for a time sufficient to complete ion exchange of Li for Na ions in the glass body. Then, the ion-exchanged glass body is cerammed at a temperature between about 550-1100° C. to cause the generation of a glass ceramic having a predominant silicate crystal phase of lithium aluminosilicate (β-spodumene and/or β-quartz solid solution), lithium metasilicate and/or lithium disilicate phase and exhibiting a glass-ceramic composition within the $SiO_2$—$R_2O_3$—$Li_2O/Na_2O$—$TiO_2$ system.

In various embodiments, a glass ceramic material may be formed using a process such as described in the '663 patent wherein the ion exchange step may be controlled so as to vary an amount of ion exchange that occurs proximate to the respective first 303 and second 305 surfaces of the material body 301. For example, in a process such as described in the '663 patent, the molar ratio of $Na_2O$ to $Li_2O$ may be formed with a gradient over the entire thickness of the body by controlling the ion exchange process conditions. The ion-exchanged glass body may then undergo ceramming to provide a glass ceramic material having a variation in crystal microstructure (e.g., variation in amount of crystallization and/or size of crystals) between the first surface 303 and the second surface 305 of the material body 301. Thus, the opacity and scattering characteristics of the first surface 303 may be increased relative to the second surface 305.

Colorants in the form of metallic ions may be present in the glass ceramic material in order to impart various colors or tints to the glass ceramic material. The color and/or tint of the material be selected to match the surfaces surrounding a display unit (e.g., an interior surface of a vehicle).

In some embodiments, the material system 300 may include a glass ceramic material body 301 that may be formed with an oriented crystal structure, such as by stretching or pushing the material during the ceramming process. The oriented crystallites may help contain the reflected image towards the viewer. This may enable a surface display unit with a relatively low viewing angle but high brightness, which may improve the energy efficiency of the display unit. The glass ceramic material with oriented crystal structure may also have a crystal size gradient as discussed above.

Referring still to FIG. 3, a material body 301 that is characterized by a higher degree of opacity on a first surface 303 than on a second surface 305 may, in exemplary embodiments, comprise a phase separated glass having a variation in microstructure through the thickness of the material. In one embodiment, a glass material body 301 may be phase separated into a first glass phase and at least one second glass phase with each of the glass phases having different compositions. Accordingly, the material body 301 may form a glass composition which is susceptible to phase separation upon exposure to a phase separation treatment (i.e., the glass composition is a "phase-separable" glass composition). The phrase "phase-separable" glass composition, as used herein, refers to a glass composition which undergoes phase separation into two or more distinct phases upon exposure to a phase separation treatment, such as a heat treatment or the like. Exemplary phase separated glass materials are described in published PCT International Application No. WO 2014/134097, which is incorporated herein by reference in its entirety.

In some embodiments, the phase separated glass material includes an interconnected matrix of glass formed from the first phase, and the second phase is dispersed throughout the interconnected matrix as discrete, unconnected regions of glass having the composition of the second phase. The size and dispersion of the regions of the second phase may be controlled to obtain a desired index of refraction in the glass material as the second phase may induce a certain amount of light scattering. Additionally or alternatively, the second phase may have a different modulus of elasticity and loss tangent than the first phase.

In some other embodiments, the phase separated glass material may be a spinodal phase separated glass (i.e., the glass material is formed from a glass composition which is susceptible to spinodal decomposition). In these embodiments the glass material may include an interconnected matrix of glass formed from the first phase with the second phase dispersed throughout the interconnected matrix of the first phase. However, in these embodiments, the second phase is itself interconnected within the interconnected matrix of the first phase.

In some embodiments, the phase separated glass material may have an opalescence or opal-type appearance due to the phase separation. The opalescence may give the glass a white opal or blue translucent opal appearance, but it should be understood that other colors are contemplated, e.g. with the addition of colorants.

In various embodiments, the process conditions of the phase separation treatment may be controlled to form a phase separated glass material body 301 having a variation in microstructure between the first 303 and second 305 surfaces of the body. For example, a glass body including phase separable materials may be subjected to a temperature gradient during the phase separation treatment in order to provide a greater degree of phase separation on one side of the material relative to the opposite side of the material. This differential in microstructure may provide different optical properties between the first surface 303 and the second surface 305 of the body, including a relatively higher degree of opacity and optical scattering on one side of the body and a relatively higher degree of optical transmittance on the opposite side of the material.

Figure 4:
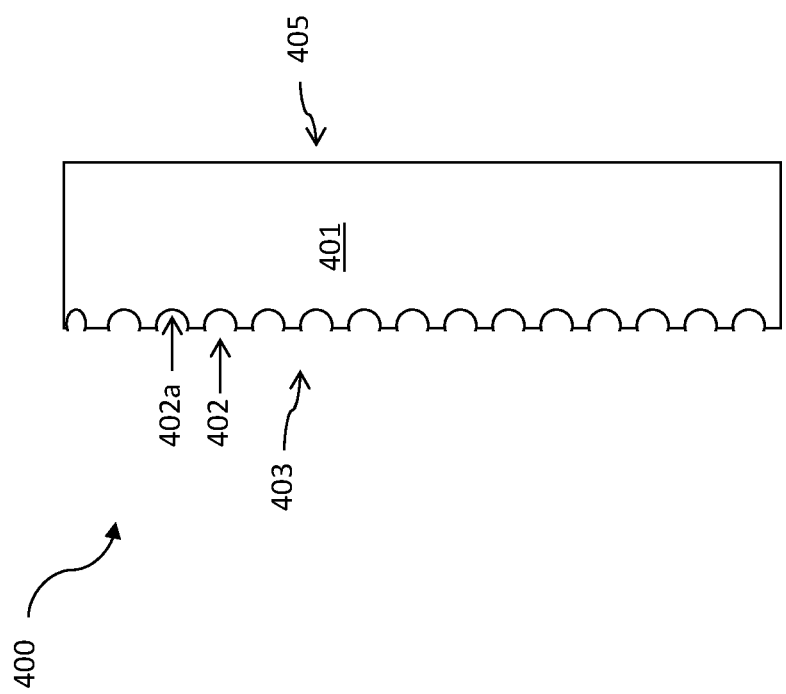
FIG. 4 is a schematic cross-sectional view of a material system for a surface display unit comprising a material body having scattering features on a first (i.e., proximal) side formed by differential etching.

FIG. 4 illustrates an exemplary material system 400 for a surface display unit that includes a material body 401 having scattering features 402 on a first surface 403 of the material body 401. The scattering features 402 may increase the opacity of the material proximate the first surface 403 and may provide a projection surface for display of images projected onto the first surface 403. The second surface 405 may have a higher degree of transparency (i.e., less scattering) relative to the first surface 403. Thus, the second surface 405 may provide increased transmittance of optical radiation incident on the second surface 405 of the material body 401.

In various embodiments, the scattering features 402 may be formed by any known process, for example differential etching of the material. The material may be a multi-phase material, such as a glass ceramic material or a phase separated glass, having two or more distinct phases with different compositions. At least one phase of the multi-phase material may have a greater dissolution rate when exposed to a particular etchant (e.g., an acid solution, such as hydrofluoric acid, hydrochloric acid, nitric acid, sulfuric acid, etc.). The first surface 403 of the multi-phase glass material body may be exposed to the etchant for a sufficient time to etch away one phase of the material and provide scattering features 402 in the form of void areas 402a on the first surface 403. The void areas may optionally be filled with another material, such as a polymer.

Alternately, scattering features 402 may be formed by etching the surface of the glass through a mask, which may be patterned using conventional techniques (e.g., photolithography).

Figure 5:
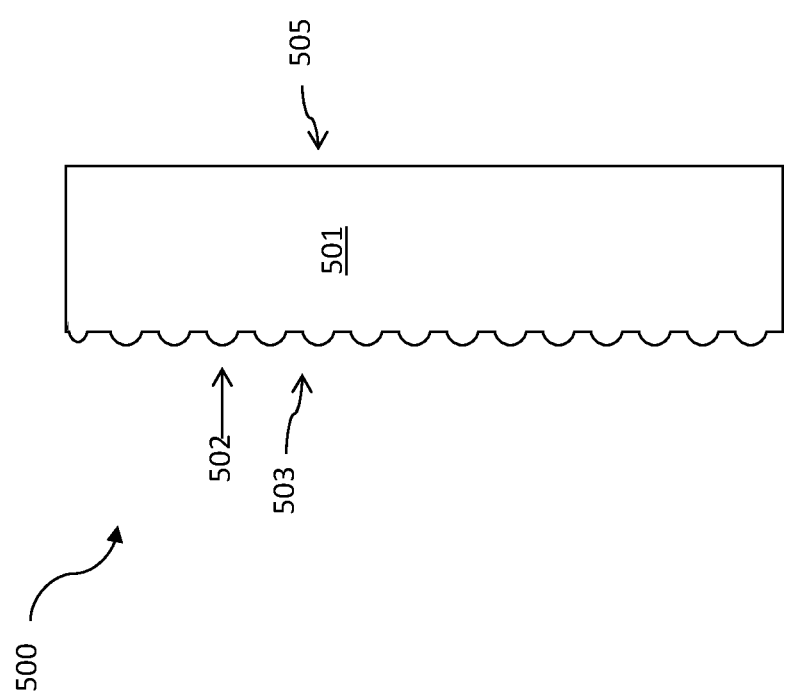
FIG. 5 is a schematic cross-sectional view of a material system for a surface display unit comprising a material body having microfeatures formed on a first (i.e., proximal) side to provide a projection surface.

FIG. 5 illustrates an embodiment material system 500 for a surface display unit that includes a material body 501 having one or a plurality of micro- and/or nano-sized features 502 on a first surface 503 of the material body 501. The features 502 may be configured to increase the opacity of the first surface 503 and provide a projection surface for display of images projected onto the first surface 503. The second surface 505 may have a higher degree of transparency (i.e., less scattering) relative to the first surface 503. Thus, the second surface 505 may provide increased transmittance of optical radiation incident on the second surface 505 of the material body 501.

The micro- and/or nano-sized features 502 may comprise convex features (e.g. projections) that are arranged in any fashion, e.g. an array or monolayer, on the first surface 503 of the material body 501. An array or monolayer of features 502 may be formed by providing a plurality of generally spherically-shaped particles (e.g., microparticles or nanoparticles) on the first surface 503. The particles may comprise an oxide material, such as silica, and may have any appropriate size, e.g. may have a diameter ranging from about 1 nm to about 500 µm, such as ranging from about 150 nm to about 1 µm. In embodiments, the particles may be deposited on the first surface 503 by dip coating and/or may be formed using a self-assembly process. The material body 501 with the particles on the first surface 503 may be subjected to an elevated temperature (e.g., ranging from about 100° C. to about 600° C. or to a temperature that is slightly below the softening temperature of the material body 501) to cause the particles to bond to the first surface 503 and form surface features 502. Various embodiments for forming convex surface features on a glass material are described, for example, in PCT International Application Publication No. WO 2014/085414, which is incorporated by reference herein in its entirety.

Figure 6:
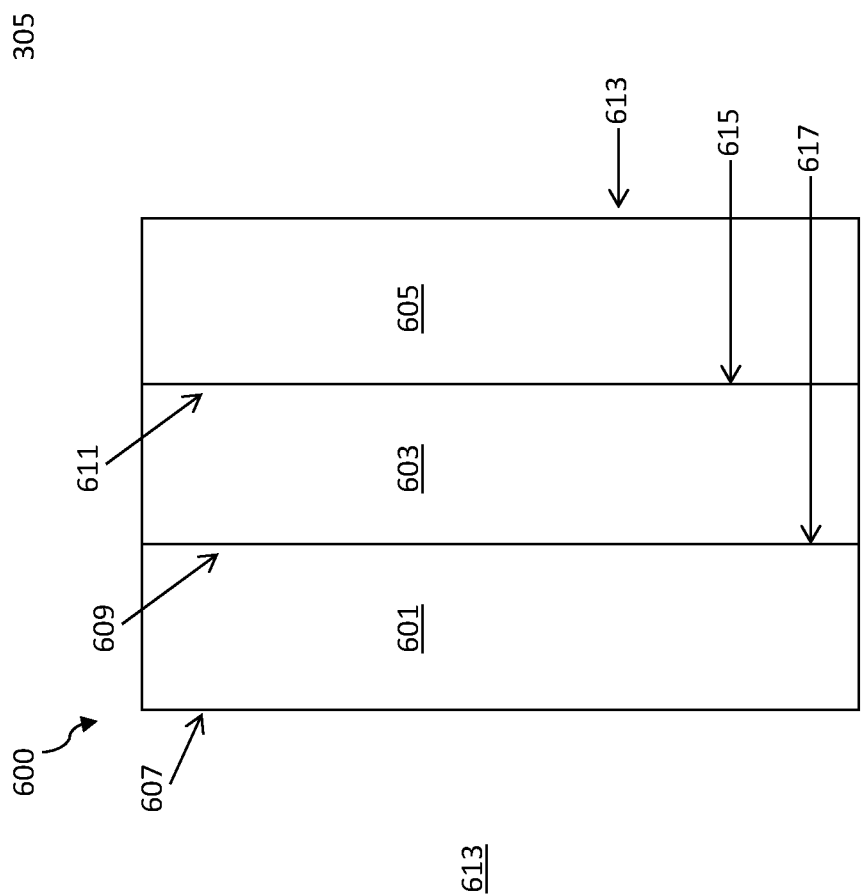
FIG. 6 is a schematic cross-sectional view of a material system for a surface display unit comprising a plurality of stacked material layers where each layer includes a different surface structure or features to promote scattering of different wavelengths.

FIG. 6 illustrates an embodiment material system 600 for a surface display unit that includes a plurality of stacked material layers 601, 603, 605. Each of the layers 601, 603, 605 includes an optical scattering surface 607, 609, 611 facing a viewer-side 613 of the material system 600. The optical scattering surfaces 607, 609, 611 may be formed, for example, by varying the microstructure of the material layer to increase optical scattering at the surface (e.g., such as described above with reference to FIG. 3), by etching to form scattering features (e.g., such as described above with reference to FIG. 4), and/or by providing a coating or other features to the surface to promote scattering (e.g., such as described above with reference to FIG. 5). The opposing surfaces 613, 615, 617 of the layers 601, 603, 605 may face away from the viewer side 613 and may be optically transmissive.

One or more of the optical scattering surfaces 607, 609 and 611 may be designed to preferentially scatter light of a particular wavelength and/or over a particular wavelength range, while light from outside the wavelength or wavelength range may be allowed to pass through one or more of the respective material layer(s) 601, 603, and/or 605. One or more of the optical scattering surfaces 607, 609, 611 of the stacked material system may be configured to preferentially scatter light of different wavelengths/colors. Thus, for example, a first surface 607 may scatter red light (e.g., 622-780 nm), a second surface 609 may scatter green light (e.g., 492-577 nm), and/or a third surface may scatter blue light (e.g., 455-492 nm). An optical source (e.g., a laser scanner projector) may project light from the viewer side 613 onto the stack of glass layers, where one or more scattering surface(s) 607, 609, 611 may selectively scatter light of a different color/wavelength range. By way of illustrative example, a laser scanner projector may direct a plurality of monochromatic (e.g., red, green and blue) light beams at predetermined locations on the viewer side of the stack, where the light beams are scattered by the surface 607, 609, 611 tuned to the respective color. The scattered light beams may be combined to provide a color image.

Although FIG. 6 shows a material system 600 having a three layer stack, it will be understood that other embodiments may include a two layer stack or a stack having more than three layers, where one or more of the layers optionally have one or more scattering surface(s) that preferentially scatter light of a particular wavelength or wavelength range.

Figure 7:
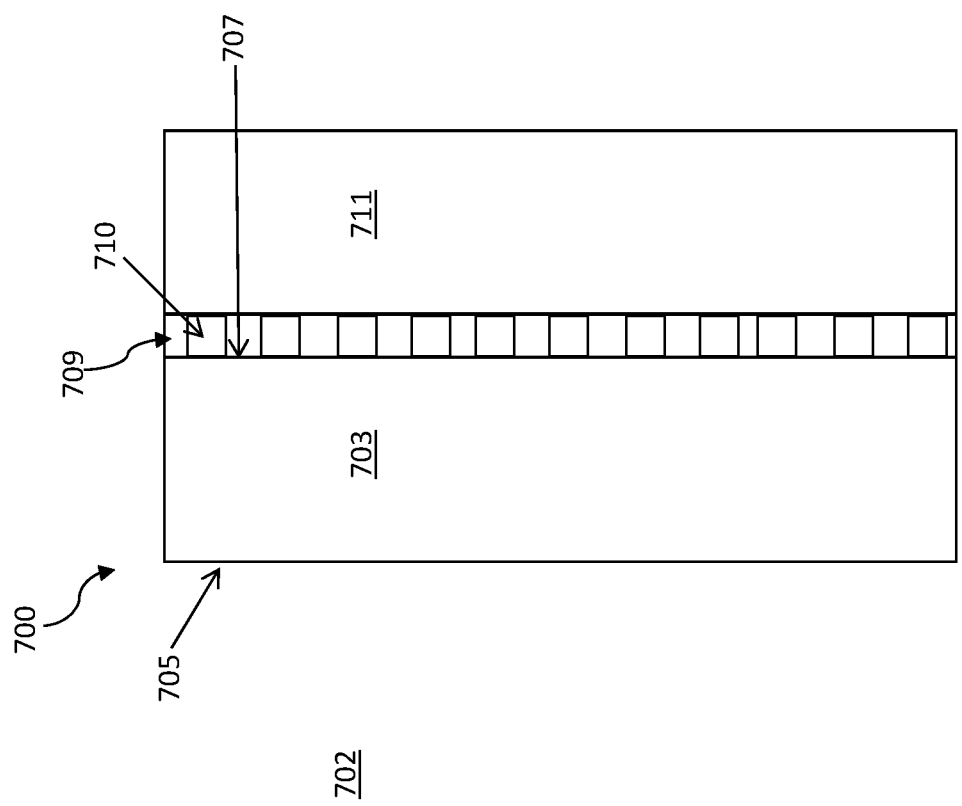
FIG. 7 is a schematic cross-sectional view of a material system for a surface display unit that includes an optically-activated light emitting element.

Another exemplary embodiment of a material system 700 for use in a surface display unit is shown in FIG. 7. The material system 700 in this embodiment includes a first layer 703, which may be a glass or glass-ceramic material for example, having a front surface 705 facing a viewer side 702, and an optically-activated light emitting element array 709 that is disposed on the rear surface 707 of the first layer 703. A backing layer 711, which may be a glass or glass-ceramic material or another type of material (e.g., polymer, ceramic, etc.), may optionally be located adjacent the optically-activated light emitting element array 709 opposite the viewer side 702.

The optically-activated light emitting element array 709 may include a plurality of light emitting elements 710 that may be excited optically (i.e., alternatively or in addition to being excited electronically by electrodes, as in a conventional light emitting device). The optically-activated light emitting elements may be configured to emit light at a first wavelength in response to absorbing optical radiation (i.e., photons) at a second wavelength, where the second wavelength may be different than the first wavelength. For example, a light emitting element may emit visible light having a particular color in response to absorbing optical radiation having an excitation wavelength, which may in the visible, ultraviolet or infrared range. In one embodiment, the light emitting element array 709 may comprise a plurality of organic light emitting diodes (OLEDs) that exhibit a photoluminescence effect. Different OLEDs of the array 709 may emit different color light. The OLED array 709 may optionally be hermetically sealed between the first layer 703 and the backing layer 711. The OLED array 709 may, in exemplary embodiments, be a flexible array which can facilitate use in curved or other three-dimensional surface display units.

Alternatively or in addition to OLEDs, the light emitting element array 709 may comprise a plurality of quantum dots (e.g., semiconductor nanoparticles which exhibit quantum mechanical properties by spatially confining excitons in all three dimensions). The quantum dots may be optically excited by incident radiation to cause the quantum dots to emit light in one or more colors.

In some embodiments, the optically-activated light emitting element (e.g., OLED) array 709 may be excited by ambient light that may pass through the first layer 703 of the material system. The array 709 may be configured to emit a particular color in the presence of ambient light. For example, for a multi-color OLED array 709, the array 709 may emit white light in the presence of ambient light, which may provide an opaque white background for the display unit. The first layer 703 may be relatively thick to enhance the diffuse, opaque white background appearance of the display. Alternately or in addition, an optical source (e.g., a UV source) may direct light onto all or a portion of the OLED array 709 to optically excite at least a portion of the OLEDs to cause them to emit light having a particular color and/or in a particular pattern. For example, a projection unit may illuminate the array using wavelengths) configured to excite a sub-set of the OLEDs (e.g., the blue-emitting OLEDs). Thus, the background color of the display unit may be changed by optically exciting different color OLEDs to emit light. In some embodiments, different areas of the OLED array 709 may be optically excited using one or more optical sources to cause the OLED array 709 to display information, symbols or other images, including color images and/or video. The optical source may illuminate the OLED array 709 from the front, the rear and/or from the side of the OLED array 709.

In some embodiments, light extraction features may be used to enhance light emission and/or image quality from the OLED array 709 when viewed from the viewer side 702 of the material system 700. The extraction features may be located on the front surface 705 and/or on the rear surface 707 of the first layer 703, for example. The extraction features may also promote optical scattering of light transmitted from the viewer side 702 into the material system 700. Thus, the extraction features may provide a scattering surface for projecting images onto the first layer 703 using a projection unit located on the viewer side 702 of the material system 700. The projection unit may project the images using wavelengths that do not excite the OLEDs. In embodiments, the front surface 705 of the first layer 703 may have an optical scattering surface that may be formed, for example, by varying the microstructure of the glass material layer to increase optical scattering at the surface (e.g., such as described above with reference to FIG. 3), by etching to form scattering features (e.g., such as described above with reference to FIG. 4), and/or by providing a coating or other features to the surface to promote scattering (e.g., such as described above with reference to FIG. 5).

The OLEDs may be generally transparent and in embodiments an opaque material may be located behind the OLED array 709. For example, the backing layer 711 may comprise an opaque material or an opaque material may be provided over a surface of the backing layer 711. In some embodiments, the OLED array 709 may include metal electrodes (e.g., cathodes) that can produce a mirror-like appearance. Scattering features may be used to make the image appear less mirror-like and more like a color.

Figure 8:
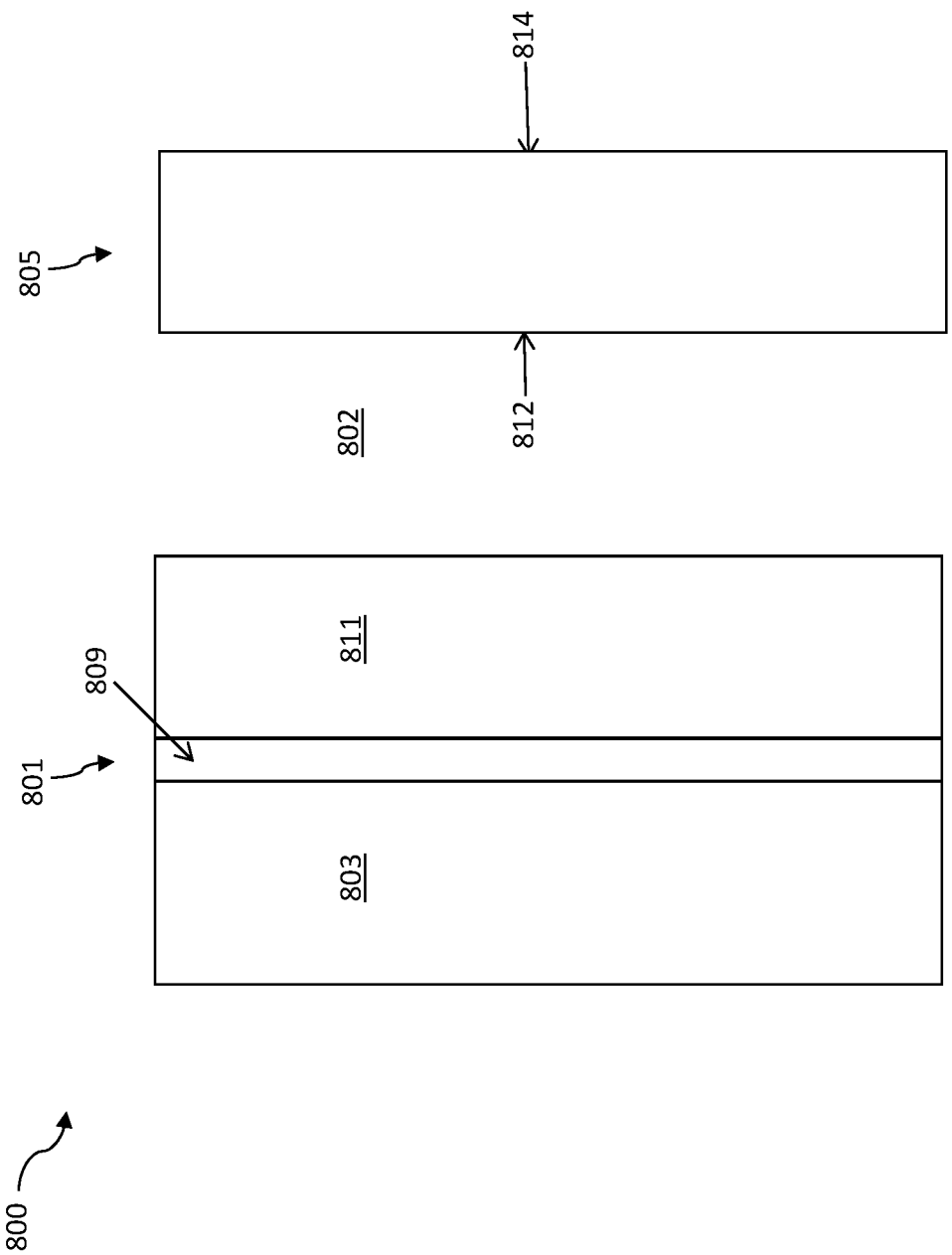
FIG. 8 is a schematic cross-sectional view of a material system for a surface display unit that includes two different types of displays in a stacked configuration with a gap between the displays.

FIG. 8 illustrates another embodiment of a material system 800 for use in a surface display unit that includes two different types of displays 801, 805 in a stacked configuration with a gap 802 between the displays. In this embodiment, a first display 801 comprises an optically activated light emitting element array 809, such as an OLED array or quantum dot array as described above with reference to FIG. 7. The first display 801 may include a first layer 803 on a front side of the optically-activated light emitting element array 809, and a second layer 811 on a rear side of the array 809. Both of the layers 803, 811 may be optically transmissive and may be formed of a glass or glass-ceramic material. A second display 805 may be located on the rear side of the first display 801 and may be separated from the first display 801 by a gap 802.

In one embodiment, the second display 805 may comprise an electrophoretic display. Electrophoretic displays are used as electronic paper in e-reader devices, for example. These displays may be used to form images by rearranging charged particles containing pigments via the application of an electric field. Electrophoretic displays may utilize reflected light, and thus may not require a backlight as in other display technologies. Electropheretic displays may be flexible and may be used in a three-dimensional surface display unit. An electrophoretic display 805 may be made conformal with a three-dimensional first display 801 to avoid shadowing and to provide a reasonable viewing angle.

In one embodiment, an electrophoretic display 805 may include a front surface 812 that faces the viewer and a rear surface 814 opposite the front surface 812. The front surface 812 of the electrophoretic display 805 may optionally be configured to display a background image for the material system 800. The front surface 812 may comprise a transparent projective layer, which may comprise a polymer (e.g., plastic) material. Driver circuitry for the display may be located adjacent to the rear surface 814. The electrophoretic display 805 may comprise a plurality of microcapsules (i.e., pixels) encapsulating a solution (e.g., oil) containing a plurality of charged particles (e.g., negatively charged titanium dioxide particles) suspended in the solution. The solution may be colored with a first color (e.g., black) and the particles may be colored with at least one second color (e.g., white) that is different than the first color. The microcapsules may be sandwiched between a pair of electrode arrays, where the electrode array adjacent to the front surface 812 of the electrophoretic display 805 may be transparent. Application of an electric charge to the electrodes may cause the particles to move either toward or away from the front surface 812 of the display and may be used to selectively control/modify the color of each pixel.

Electrophoeretic displays may be effective in ambient light, including in bright sunlight. Electrophotric displays are characterized by relatively low power consumption and may retain the displayed image when power is turned off. Electrophoretic displays may display at least two different colors (e.g., white and black) or may be able to display additional colors through the use of color filters and/or multi-pigment particles. In some embodiments, the appearance of the electrophoretic display 805 may match an interior decor of a vehicle (e.g., such as providing a leather look having the same color as the vehicle interior).

In one embodiment, an electrophoretic display 805 may be used to display a user-selectable background color for a surface display unit. For example, the electrophoretic display 805 may be used to change the background between a darker color (e.g., black, brown, dark red, etc.) and a lighter color (e.g., white) over all of a portion of the display. In some embodiments, the electrophoretic display 805 may be used to display information, a pattern, and/or other image on the surface display unit.

In some embodiments, the electrophoretic display 805 may be used in conjunction with the optically-activated light emitting element array 809 (e.g., OLED or quantum dot array) to modify the background color of a surface display unit. For example, the optically-activated light emitting element array 809 may be optically excited (e.g., via a front projection unit) to generate light having a preselected color. The light from the array 809 may reflect from the front surface 812 of the electrophoretic display 805 (which may display a white or light colored surface) to provide a color background for the display unit. In embodiments, the front surface 812 of the electrophoretic display 812 may have a roughened, patterned or textured surface to provide optical scattering. The scattering surface may be formed by etching or depositing material, for example. In some embodiments, the optically-activated light emitting element array 809 may be used to project information onto the electrophoretic display 805.

The gap 802 between the first display 801 and the second display 805 may reduce double imaging effects, and may be sufficient to diffuse any shadowing or projected image from the first display 801 (e.g., OLED array) onto the front surface 812 of the second display 805. In one embodiment, the gap 802 may range up to about 3 cm in width, such as from about 100 μm to about 2.54 cm in width.

In some embodiments, the first layer 803 may provide a scattering surface to enable projective display from the front, as discussed above with reference to FIG. 7. Scattering features on the first layer 803 may also reduce the impact of ambient light (i.e., provide anti-glare effects).

Figure 9B:
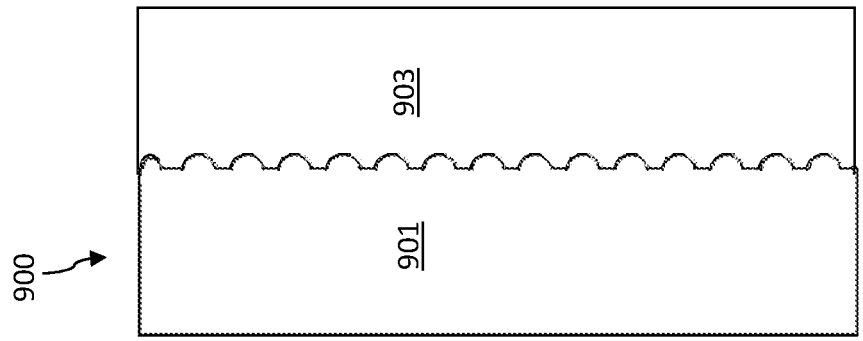
FIGS. 9A and 9B are schematic cross-sectional views of a material system for a surface display unit that includes two layers with micro-replicated features facing one another.
Figure 9A:
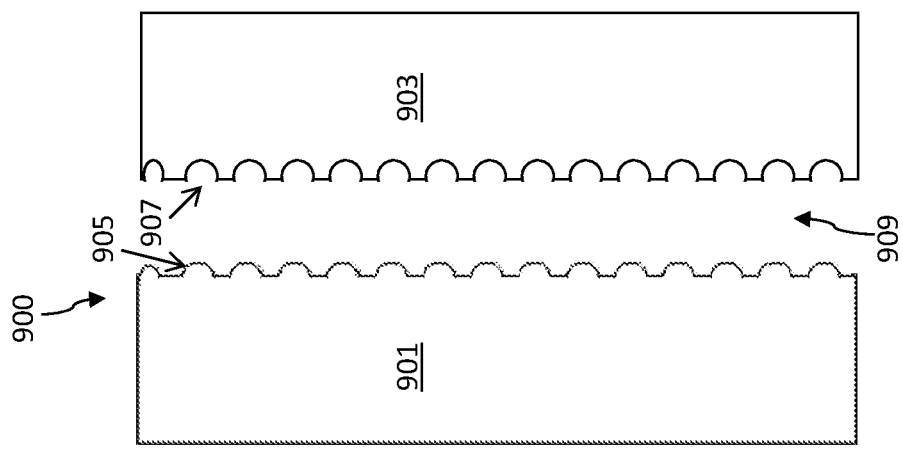

FIGS. 9A and 9B illustrate yet another exemplary embodiment of a material system 900 for a surface display unit. The material system 900 in this embodiment includes two layers 901, 903, which may be glass or glass-ceramic layers for example, where the layers include complementary micro-replicated features 905, 907 facing one another. Between the layers 901, 903 is a material 909 that provides a mechanical means to separate the layers 901, 902 so that there is a gap between them (as shown in FIG. 9A) or bring the layers together so that the layers 901, 903 form a combined layer with the micro-replicated features 905, 907 joining (as shown in FIG. 9B). In one or more embodiments, material 909 may be air. In the separated state, as shown in FIG. 9A, the features 905, 907 provide a scattering surface that may enable projective display from the front (i.e., viewer) side. In the unified shape, as shown in FIG. 9B, there is minimal scattering that may enhance emissive display through the material system 900 from the rear.

FIG. 10 illustrates another embodiment of a material system 1000 for a surface display unit that comprises a switchable material 1001 that is capable of being switched between two states to provide variable opacity/light transmission. The switchable material layer 1001 may provide a first level of light transmission in a first state, or an "on" state, and provide a second level of light transmission in a second state, or an "off" state. In some embodiments, a transmission coefficient of the switchable material layer 1001 as a function of wavelength may be dependent on the state of the layer 1001.

As shown in FIG. 10, the switchable material layer 1001 may have a first surface 1003 that may face the front or viewer side of a surface display unit (such as shown in FIG. 1) and a second surface 1005 that may face the rear side of the surface display unit. An optical source 1007, which may be an image panel comprising a micro-LED, an OLED, a LCD, a plasma cell, an electroluminescent (EL) cell array, or another suitable element configured to emit radiation) or a projection unit, for example, may be located adjacent to the second surface 1005 of the switchable material layer 1001.

The switchable material layer 1001 may be capable of switching between an opaque state and a light transmissive state in a rapid fashion. In embodiments, the switchable material layer 1001 may utilize electrically switchable smart glass technology, such as an electrochromatic material, a suspended particle device, a polymer dispersed liquid crystal device, nanocrystals and/or micro-blinds, for example. The layer 1001 may be switched between opaque and transmissive states by varying a voltage applied to the material. Alternatively or in addition, the switchable material layer 1001 may utilize photochromic, polychromic and/or thermochomic systems. For example, a photochromic glass material may be located at the first surface 1003 of the switchable material layer 1001 and may provide a waveguide for light to actively switch between an opaque state and a light transmissive state.

When the switchable material layer 1001 is in an opaque state, the front surface 1003 of the layer 1001 may be illuminated by a front projection unit (see, e.g., FIG. 1) to display a high-quality image on the material system 1000. When the switchable material layer 1001 is in a transmissive state, the layer 1001 may enable sufficient optical transmission through the layer 1001 to display a high-quality image from the optical source 1007. The switchable material layer 1001 may include individual addressable segments, such that the opacity/light transmission of discrete portions of the layer 1001 may be selectively modified. The discrete segments may, for example, be pixel size or larger.

The switchable material layer 1001 may be planar or substantially planar, or may have a curved or three-dimensional contour to provide a three-dimensional surface display unit. The switchable material layer 1001 may include one or more thin surface layers on a strengthened substrate to create a stack. Two diffusers with exact mirror aperture, moving together may create a transparent surface.

In embodiments, the switchable material layer 1001 may comprise one or more of a polymeric material, a glass material (e.g., soda lime glass, alkali aluminosilicate glass, alkali containing borosilicate glass and/or alkali aluminoborosilicate glass), a poly-ceramic material, or a glass-ceramic material, for example. The layer 1001 may, in various embodiments, be provided as a single sheet or as part of a laminate or stacked structure. In some embodiments, the switchable material layer 1001 may be a stacked or laminate structure, for example including a glass layer and a diffusion material layer (e.g., a diffuser film or a light-scattering film). According to various exemplary embodiments, the diffusion material may comprise a polymeric material. The diffusion material may be in the form of a single layer or a stack of multiple layers provided that there is at least one material layer that is engineered to provide optical scattering. In an illustrative example, optical scattering within a diffusion material layer may be provided by a light diffuser film made of polymers.

In one embodiment, the switchable material layer 1001 may include a dye-sensitized material layer. In this case, the switchable material layer 1001 can be a dye-sensitized screen (i.e., a dye-doped screen) that changes color upon irradiation of an activating radiation thereupon. In one embodiment, the activating radiation may be provided by a light source provided on either side, or on both sides, of the switchable material layer 1001. In another embodiment, the activating radiation may be provided by a light source provided within the optical source 1007, which may be an image panel. In this case, the activating radiation may be provided by a set of at least one dedicated light source embedded within the image panel 1007 and separate from the light sources employed to form the optical image, or may be provided by a subset of the light sources that can be employed to form the optical image. In one embodiment, the activating radiation may be ultraviolet light or visible light. The activating radiation may be provided by one or more light emitting diodes. In one embodiment, only one type of activating radiation source may be provided. In another embodiment, multiple dye materials that are activated to emit lights of different wavelengths and/or activated by radiation of different wavelengths may be embedded within the switchable material layer 1001. In this case, multiple types of activating radiation having different wavelengths may be employed to cause the switchable material layer 1001 to display different colors depending on the wavelength of the activating radiation.

In one embodiment, the switchable material layer 1001 can include a dye-doped liquid crystal that incorporates two or more materials that interact with each other or with one another to generate optical effects. In one embodiment, the dye-doped liquid crystal can be employed to reduce transmission of light, thereby providing an opaque material portion that provides a low level of optical transmission from the optical source 1007 to the viewer.

In one embodiment, the switchable material layer 1001 may include a polarization filter to reduce scattering of ambient light without hindering transmission of the light therethrough from the optical source 1007. In some embodiments, the switchable material layer 1001 may comprise a screen that reflects only certain frequencies. A projection unit may illuminate the screen with light at these frequencies, which may be reflected (i.e., scattered) to provide an optical image while ambient light is not similarly reflected.

For a vehicular display, the windows of the vehicle may be configured to minimize interference with the display by ambient light. For example, the windows may include a multilayer coating or other material to reduce the amount of ambient light. In one embodiment, the vehicle windows may include a photochromatic material layer. The photochromatic material may change transmission coefficient when activated by an activating radiation, such as bright sunlight. For example, the photochromatic material can include a matrix of polyvinyl butyral (PVB) embedding quantum dots that are activated by the activating radiation, and may decrease the light transmission through the material.

Material systems according to various embodiments of the disclosure may provide surface display units with three different appearance states by employing one or any combination of the configurations described herein. Specifically, any one or more of the above-described configurations may provide for the surface display unit to appear generally opaque in a first appearance state when the surface display unit is off; may provide for the surface display unit to have a second appearance state when illuminated from the first side; and may provide for the surface display unit to have a third appearance state when illuminated from the second side. The difference between the three different appearance states may be perceptible to a viewer.

The various embodiments of the present disclosure can be employed alone, or in combination with any other embodiment except for cases in which a combination is expressly prohibited or otherwise clearly described Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art.

It is also to be understood that, as used herein the terms "the," "a," or "an," mean "at least one," and should not be limited to "only one" unless explicitly indicated to the contrary. Thus, for example, reference to "a layer" includes examples having two or more layers unless the context clearly indicates otherwise. Likewise, a "plurality" or an "array" is intended to denote "more than one."

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. For example, the phrase "from about A to C, such as B," is intended to convey at least the following: "about A to about C," "exactly A to exactly C," "about A to exactly C," "exactly A to about C," "about A to about B," "exactly A to exactly B," "about A to exactly B," "exactly A to about B," "about B to about C," "exactly B to exactly C," "about B to exactly C," "exactly B to about C," "about A," "exactly A," "about B," "exactly B," "about C," and "exactly C."

The terms "substantial," "substantially," and variations thereof as used herein are intended to note that a described feature is equal or approximately equal to a value or description. For example, a "substantially planar" surface is intended to denote a surface that is planar or approximately planar.

Unless otherwise expressly stated, it is in no way intended that any method set forth herein be construed as requiring that its steps be performed in a specific order. Accordingly, where a method does not actually recite an order to be followed by its steps or it is not otherwise specifically stated in the claims or descriptions that the steps are to be limited to a specific order, it is no way intended that any particular order be inferred.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a method that comprises A+B+C include embodiments where a method consists of A+B+C and embodiments where a method consists essentially of A+B+C.

The invention claimed is:

1. A material system for a surface display unit comprising:
   a first side configured to face a viewer of the surface display unit;
   a second side opposite the first side and facing away from the viewer; and
   a material body comprising:
      a first surface proximate to the first side of the material system and a second surface proximate to the second side of the material system, the first surface having a higher degree of opacity and optical scattering than the second surface;
      one or more layers comprising at least one of a glass material or a glass-ceramic material; and
      a gradient to a crystal grain size such that a first average crystal grain size proximate to the first surface is larger than a second average crystal grain size proximate to the second surface; and
      wherein the material system is configured to have at least three appearance states, including:
         (i) a generally opaque first appearance state when the surface display unit is not displaying an image;
         (ii) a second appearance state wherein the material system is illuminated from the first side to display a first image that is perceptible to the viewer; and
         (iii) a third appearance state wherein the material system is illuminated from the second side to display a second image that is perceptible to the viewer.

2. The material system of claim 1, wherein the material system comprises a plurality of stacked layers of a glass or glass-ceramic material, wherein one or more of the layers comprises an optical scattering surface facing a viewer-side of the material system that preferentially scatters light of different wavelengths.

3. The material system of claim 1, wherein the material system
   has a first layer of the one or more layers comprising the glass or glass-ceramic material having a proximal surface facing a viewer-side of the material system and a distal surface facing away from the viewer side; and
   an optically-activated light emitting element array located on the distal surface of the first layer.

4. The material system of claim 3, wherein the optically-activated light emitting element array is configured to provide an opaque illuminated background appearance for the surface display unit.

5. The material system of claim 3, wherein the optically-activated light emitting element array is configured to provide a user-modifiable background color for the surface display unit.

6. The material system of claim 3, wherein the optically-activated light emitting element array is configured to display different colors and/or patterns of light when illuminated by an optical excitation source.

7. The material system of claim 6, wherein the optical excitation source is configured to illuminate the optically-activated light emitting element array from the front, rear or side of the material system.

8. The material system of claim 3, wherein the gradient to the crystal grain size promotes light emission from the optically-activated light emitting element array to the viewer-side of the material system.

9. The material system of claim 1, wherein the material system comprises at least two different types of displays in a stacked configuration with a gap between the displays.

10. The material system of claim 9, wherein a first display of the at least two displays comprises:
    a first layer of the one or more layers comprising the glass or glass-ceramic material having a proximal surface facing a viewer-side of the material system and a distal surface facing away from the viewer side; and
    an optically-activated light emitting element array located on the distal surface of the first layer; and
    wherein a second display comprises an electrophoretic display having a proximal surface configured to display a background image for the material system.

11. The material system of claim 10, wherein the optically-activated light emitting element array is configured to emit light onto the proximal surface of the electrophoretic display to modify a background color of the material system.

12. The material system of claim 10, wherein the gap between at least two displays is sufficient to diffuse any shadowing or projected image from the first display onto the front surface of the second display.

13. A surface display unit having a material system as recited in claim 1, further comprising a first optical source for illuminating the material system from the first side of the material system and a second optical source for illuminating the material system from the second side of the material system.

14. The surface display unit of claim 13, wherein the first optical source comprises a front projection unit and the second optical source comprises at least one of: a micro-LED array, an OLEO array, a LCD array, a plasma cell array, an electroluminescent (EL) cell array, an electrophoretic display and a rear projection unit.

15. The surface display unit of claim 13, wherein the surface display unit comprises a vehicle display.

16. The material system of claim 1, wherein the first side comprises a projection surface configured to display the first image when the projection surface is illuminated by a front projection unit.

* * * * *